(12) United States Patent
Convert et al.

(10) Patent No.: US 9,508,658 B1
(45) Date of Patent: Nov. 29, 2016

(54) ELECTROMAGNETIC WALL IN MILLIMETER-WAVE CAVITY

(71) Applicant: MACOM Technology Solutions Holdings, Inc., Lowell, MA (US)

(72) Inventors: Emmanuelle R. O. Convert, Cammeray (AU); Ryan M. Clement, East Launceston (AU); Simon J. Mahon, Avalon (AU)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/848,777

(22) Filed: Sep. 9, 2015

Related U.S. Application Data (60) Provisional application No. 62/201,262, filed on Aug. 5, 2015.

(51) Int. Cl.
| | |
|---|---|
| *H01L 23/552* | (2006.01) |
| *H01L 23/66* | (2006.01) |
| *H01L 23/053* | (2006.01) |
| *H01L 23/498* | (2006.01) |
| *H01L 21/48* | (2006.01) |
| *H01L 25/00* | (2006.01) |
| *H01L 25/065* | (2006.01) |

(52) U.S. Cl.
CPC ......... *H01L 23/552* (2013.01); *H01L 21/4817* (2013.01); *H01L 21/4853* (2013.01); *H01L 23/053* (2013.01); *H01L 23/49811* (2013.01); *H01L 23/49838* (2013.01); *H01L 23/66* (2013.01); *H01L 25/0655* (2013.01); *H01L 25/50* (2013.01)

(58) Field of Classification Search
CPC ............. H01L 23/552; H01L 25/0655; H01L 23/49811; H01L 21/4853; H01L 21/4817; H01L 25/50; H01L 23/053; H01L 23/66; H01L 23/49838
See application file for complete search history.

(56) References Cited

U.S. PATENT DOCUMENTS

| | | | |
|---|---|---|---|
| 6,507,110 B1* | 1/2003 | Chen ....................... | H01L 23/66 257/259 |
| 8,012,868 B1* | 9/2011 | Naval ................... | H01L 23/552 257/784 |

* cited by examiner

*Primary Examiner* — Roy Potter
*Assistant Examiner* — Paul Patton
(74) *Attorney, Agent, or Firm* — Christopher P. Maiorana, PC (57) ABSTRACT

An apparatus having a package, a wall and a lid is disclosed. The package may be configured to mount a plurality of chips. Two of the chips may generate a plurality of signals in a millimeter-wave frequency range. A metal is exposed at a surface of the package between the two chips. The metal is generally connected to an electrical ground. The wall may be formed on the metal and between the two chips. The wall generally has a plurality of arches that (i) are conductive, (ii) are wire bonded to the metal and (iii) attenuate an electromagnetic coupling between the two chips at the millimeter-wave frequency. The lid may be configured to enclose the chips to form a millimeter-wave cavity.

20 Claims, 8 Drawing Sheets

ELECTROMAGNETIC WALL IN MILLIMETER-WAVE CAVITY

This application relates to U.S. Provisional Application No. 62/201,262, filed Aug. 5, 2015, which is hereby incorporated by reference in its entirety.

FIELD OF THE INVENTION

The present invention relates to inter-chip decoupling in an extremely high frequency band generally and, more particularly, to a method and/or apparatus for implementing an electromagnetic wall in a millimeter-wave cavity.

BACKGROUND OF THE INVENTION

Conventional millimeter-wave modules are cavity modules containing multiple monolithic microwave integrated circuits. A desire for smaller modules to reduce cost, maintain mechanical strength and to maximize gain pushes designers to place the chips closer together. However, the closer spacing increases an unwanted coupling and feedback between the chips that leads to gain ripple and, in some situations, oscillation. A standard solution is to construct metal walls between the chips. The metal walls increase a cost of the module.

It would be desirable to implement an electromagnetic wall in a millimeter-wave cavity.

SUMMARY OF THE INVENTION

The present invention concerns an apparatus having a package, a wall and a lid. The package may be configured to mount a plurality of chips. Two of the chips may generate a plurality of signals in a millimeter-wave frequency range. A metal is exposed at a surface of the package between the two chips. The metal is generally connected to an electrical ground. The wall may be formed on the metal and between the two chips. The wall generally has a plurality of arches that (i) are conductive, (ii) are wire bonded to the metal and (iii) attenuate an electromagnetic coupling between the two chips at the millimeter-wave frequency. The lid may be configured to enclose the chips to form a millimeter-wave cavity.

The objects, features and advantages of the present invention include providing an electromagnetic wall in a millimeter-wave cavity that may (i) reduce inter-chip coupling, (ii) reduce inter-chip feedback, (iii) avoid unwanted oscillation, (iv) reduce ripple in a gain of an amplifier, (v) operate in the extremely high frequency band, (vi) operate in the E-band, (vii) avoid solid metal walls and/or (viii) be implemented at low cost.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the present invention generally provide one or more low cost electromagnetic walls suitable for use in millimeter-wave cavities. The walls may provide electromagnetic isolation (e.g., reduce coupling, feedback and/or oscillation) between two or more chips (or die) within the cavity. Each wall may be formed from one or more series of bond wires, bond tapes and/or bond ribbons that form arches (or loops). The walls are generally grounded on a floor of the package to provide cost-effective isolation between the chips.

The electromagnetic isolation may be useful in an extremely high frequency (e.g., EHF) range (or band) of radiation. The extremely high frequency band generally ranges from 30 to 300 gigahertz (e.g., GHz). The EHF signals generally have wavelengths of 10 millimeters to 1 millimeter (e.g., millimeter-waves). In various embodiments, the electromagnetic isolation may be applied in an E-band of radiation. The E-band generally ranges from 60 GHz to 90 GHz. The E-band signals generally have wavelengths of 5 millimeters (e.g., mm) to 3.33 mm. The wavelength values are generally stated as measured in air. In dielectrics, such as packaging material, the relative wavelengths may change by a square root of the dielectric constants.

In various embodiments, the chips may be implemented as monolithic microwave integrated circuits (e.g., MMIC). In some embodiments, the MMIC chips may include, but are not limited to, a frequency up-converter chip and/or a power amplifier chip. Other chip types may be implemented to meet the design criteria of a particular application.

Figure 1:
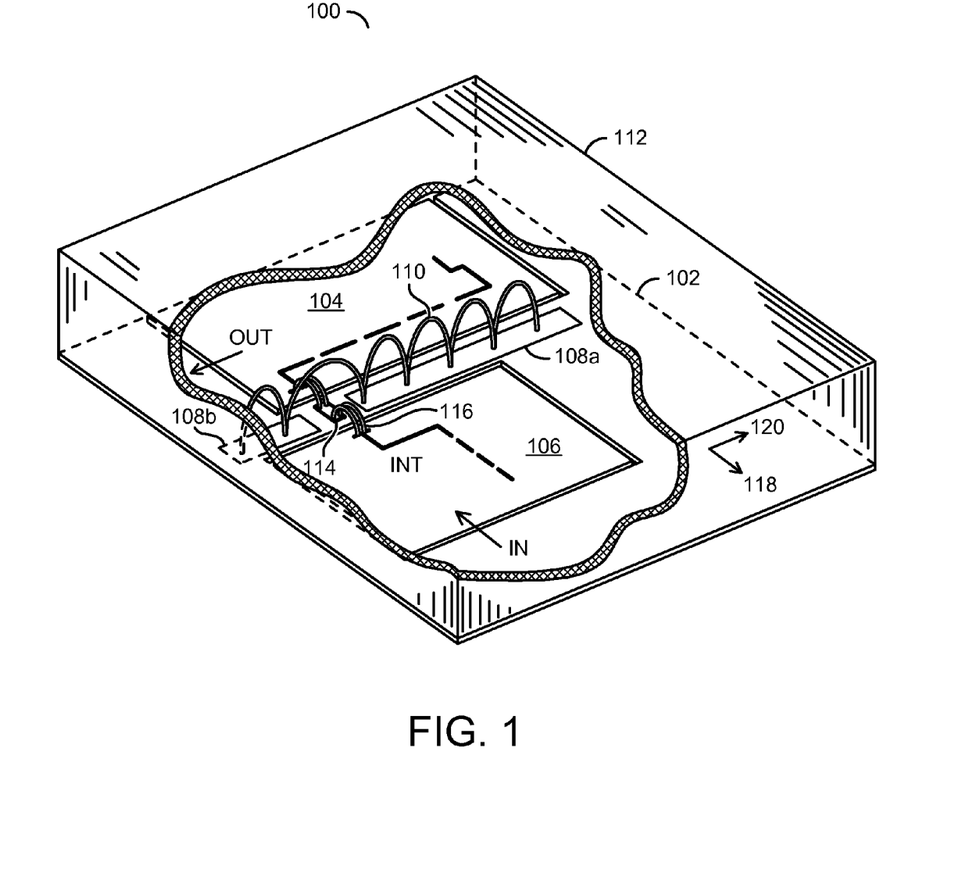
FIG. 1 is a cutaway perspective diagram of an apparatus in accordance with a preferred embodiment of the present invention.

Referring to FIG. 1, a cutaway perspective diagram of an apparatus 100 is shown in accordance with a preferred embodiment of the present invention. The apparatus (or device or circuit) 100 may implement a MMIC module. The apparatus 100 generally comprises a circuit (or substrate or carrier) 102, a block (or circuit) 104, a block (or circuit) 106, one or more blocks (or circuits) 108a-108b, a block (or circuit) 110, a housing (or lid) 112, a block (or circuit) 114 and a block (or circuit) 116. The circuits 102-116 may be implemented with hardware and/or simulated with software.

A signal (e.g., IN) may be received by the circuit 106. The signal IN generally conveys a high frequency signal (e.g., 1-10 GHz). A signal (e.g., INT) may be generated by the circuit 106 and transferred to the circuit 104. The signal INT may convey an extremely high frequency signal (e.g., in the EHF band) as an up-converted version of the signal IN. A signal (e.g., OUT) may be generated and presented by the circuit 104. The signal OUT may convey an amplified version of the signal INT. The signals INT and OUT may reside in a millimeter-wave frequency range.

The circuit 102 may be implemented as a package. The package (or carrier or board or substrate) 102 is generally operational to provide mechanical support for the apparatus 100. The package 102 may include one or more conductive layers separated by insulating layers. The conductive layers may be patterned to carry signals (e.g., the signal IN, the signal INT and the signal OUT) inside the apparatus 100. At least one conductive layer may form an electrical ground plane. The ground plane may form a surface of a millimeter-wave cavity that surrounds the circuits 104 and 106.

In some embodiments, the package 102 is generally operational to present the signal IN to the circuit 106. The package 102 may also convey the signal INT from the circuit 106 to the circuit 104. The signal OUT may be received by the package 102 from the circuit 104. Other types of signals, other signal paths and other frequency ranges may be implemented to meet the design criteria of a particular application.

The circuit 104 may implement an integrated circuit (or chip). In various embodiments, the circuit 104 is generally operational to amplify the signal INT to generate the signal OUT. In some embodiments, the circuit 104 may be a monolithic microwave integrated circuit. Other embodiments may include, but are not limited to, high frequency circuits, compound semiconductor circuits and the like.

The circuit 104 may be fabricated in compound semiconductors. In some embodiments, the circuit 104 may be fabricated in III-V compounds. The III-V compounds may include, but are not limited to, Gallium Arsenide (e.g., GaAs), Indium Phosphide (e.g., InP), etc. In various embodiments, three-compound semiconductors may be used to implement the circuit 104. The three-compound semiconductors may include, but are not limited to Aluminum Gallium Arsenide, etc. In some embodiments, the circuit 104 may be fabricated in a Silicon Germanium (e.g., SiGe) compound. In other embodiments, the circuit 104 may be fabricated in a Gallium Nitride (e.g., GaN) compound. Other materials may be used to create the circuit 104 to meet the design criteria of a particular application.

The circuit 106 may implement an integrated circuit (or chip). In various embodiments, the circuit 106 is generally operational to up-convert the frequency of the signal IN to generate the signal INT. In some embodiments, the circuit 106 may be a monolithic microwave integrated circuit. Other embodiments may include, but are not limited to, high frequency circuits, compound semiconductor circuits and the like.

The circuit 106 may be fabricated in compound semiconductors. In some embodiments, the circuit 106 may be fabricated in III-V compounds. The III-V compounds may include, but are not limited to, Gallium Arsenide, Indium Phosphide, etc. In various embodiments, three-compound semiconductors may be used to implement the circuit 106. The three-compound semiconductors may include, but are not limited to Aluminum Gallium Arsenide, etc. In some embodiments, the circuit 106 may be fabricated in a Silicon Germanium compound. In other embodiments, the circuit 106 may be fabricated in a Gallium Nitride compound. Other materials may be used to create the circuit 106 to meet the design criteria of a particular application.

The circuits 108a-108b may implement conductive surfaces exposed on a surface of the package 102. The circuits 108a-108b may be formed in a conductive layer of the package 102 between and proximate to the edges of the circuits 104 and 106 facing each other. In various embodiments, the circuits 108a-108b are electrically connected to the ground plane.

The circuit 110 may implement an electromagnetic wall. The wall 110 may be operational to reduce electromagnetic coupling between the circuit 104 and the circuit 106. The coupling may include, but is no limited to, inter-chip interference, feedback and/or oscillation. In some embodiments, the wall 110 may comprise a series of arches (or loops) formed from one or more bond wires, bond tapes and/or bond ribbons. The wall 110 generally provides a millimeter-wave shield between the circuit 104 and the circuit 106.

In various embodiments, the wall 110 may be a single continuous structure physically located between the circuit 104 and the circuit 106. In other embodiments, the wall 110 may be multiple structures that form a barrier to the electromagnetic radiation (or signals) broadcast by the circuits 104 and 106. The bonding may be performed by an automated or manual bonding process.

Where bond wire is used to form the wall 110, the bond wire is generally fabricated as a conductive (or metal) wire having a diameter of approximately 15 micrometers (e.g., μm) to 25 μm. In various embodiments, the conductive wire may be a gold wire, a platinum wire, a copper wire, an aluminum wire, a silver wire or another metal wire. Other diameters and/or conductors may be implemented to meet the design criteria of a particular application. Where a bond ribbon or tape is used to form the wall 110, the ribbon/tape is generally fabricated as a conductive (or metal) ribbon having a thickness of approximately 15 μm to 100 μm and a width of approximately 50 μm to 150 μm. In some embodiments, the conductive ribbon/tape may be gold ribbon/tape, a platinum ribbon/tape, a copper ribbon/tape, an aluminum ribbon/tape, a silver ribbon/tape or other metal ribbon/tape. Other widths, thicknesses and/or conductors may be implemented to meet the design criteria of a particular application.

The circuit 112 may implement a lid. The lid 112 is generally operational to provide mechanical enclosure and electromagnetic enclosure of the circuits 104 and 106. At least an inside surface (e.g., ceiling) of the lid 112 may be conductive and electrically grounded to the ground plane of the package 102.

The circuit 114 may implement one or more traces on the surface of the package 102. The circuit 114 is generally operational to convey signals between the circuits 104 and 106 along one or more paths. In some embodiments, the circuit 114 may carry the signal INT from the circuit 106 to the circuit 104. In various embodiments, the circuit 114 may be straddled by (pass under) one or more of the arches of the wall 110. Other numbers and paths of the circuit 114 may be implemented to meet the design criteria of a particular application.

The circuit 116 may implement bond wires. In some embodiments, the circuit 116 may implemented bond tapes or bond ribbons. The circuit 116 is generally operational to connect the circuits 104 and 106 to the circuit 114. The circuit 116 may be fabricated using the same types of wire, ribbons and/or tapes as the wall 110.

An orientation of the circuits 108a-108b and the wall 110 may be based on the location of the circuits 104 and 106 relative to each other. As illustrated in FIG. 1, the circuits 104 and 106 are physically separated from each other in a direction 118. Each circuit 104 and 106 has a side oriented in a direction 120 that faces the other circuit. The circuits 108a-108b may be oriented along the direction 120 and physically located between the circuits 104 and 106. The wall 110 may also be oriented in a line along the direction 120 and physically located between the circuits 104 and 106.

Figure 2:
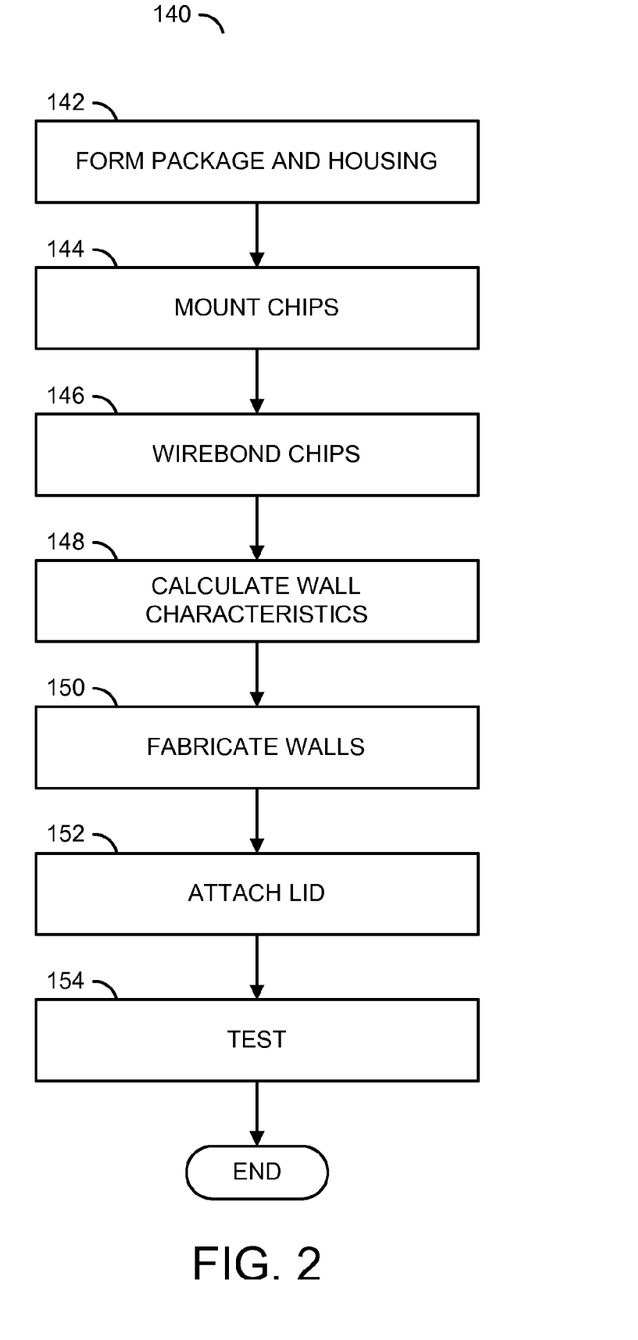
FIG. 2 is a flow diagram of a method for creating the apparatus.

Referring to FIG. 2, a flow diagram of an example method 140 for creating the apparatus 100 is shown. The method (or process) 140 may be performed in a normal semiconductor fabrication facility using normal fabrication techniques. The method 140 generally comprises a step (or state) 142, a step (or state) 144, a step (or state) 146, a step (or state) 148, a step (or state) 150, a step (or state) 152 and a step (or state)

154. Other step orders may be implemented to meet the design criteria of a particular application.

In the step 142, the package 102 and the lid 112 may be formed. The circuits (or chips) 104 and 106 may be mounted on the package 102 in the step 144. In the step 146, the circuits 104 and 106 may be wire bonded to the circuit 114, other traces and pins of the package 102.

In the step 148, calculations for the characteristics of the wall 110 may be performed. In various embodiments, the step 148 may occur earlier in the method 140 as the apparatus 100 is being designed. In some embodiments, the calculations may be performed using commercial three-dimensional electromagnetic simulation tools, such as the simulation tools available from Computer Simulation Technology. Empirical data may also be used by measuring various bonding configurations to establish specified attenuation characteristics through the wall 110.

The openings formed by the arches between each other, to the floor of the package 102 and to the ceiling of the lid 112 may be designed to shield the stray electromagnetic signals over the intended frequency of operation for the circuits 104 and 106, and possibly a few higher harmonic frequencies. In general, individual arch openings and the arch-to-arch openings may be less than a wavelength of the frequencies to be attenuated. Other widths may be implemented to meet the design criteria of a particular application.

Multiple rows of the wall 110 may be designed to achieve smaller openings. Staggered and parallel rows of the arches may reduce a size of the openings along the direction 120. Parallel rows of arches at different heights may reduce the size of the openings to the floor of the package 102 and the ceiling formed by the lid 112. Several rows of the arches may be created to form a grounded mesh between the circuits 104 and 106.

In the step 150, the wall 110 may be fabricated using one or more bond wires, bond tapes and/or bond ribbons. The lid 112 may be attached to the package 102 in the step 152. The completed apparatus 100 may be tested in the step 154.

Figure 3:
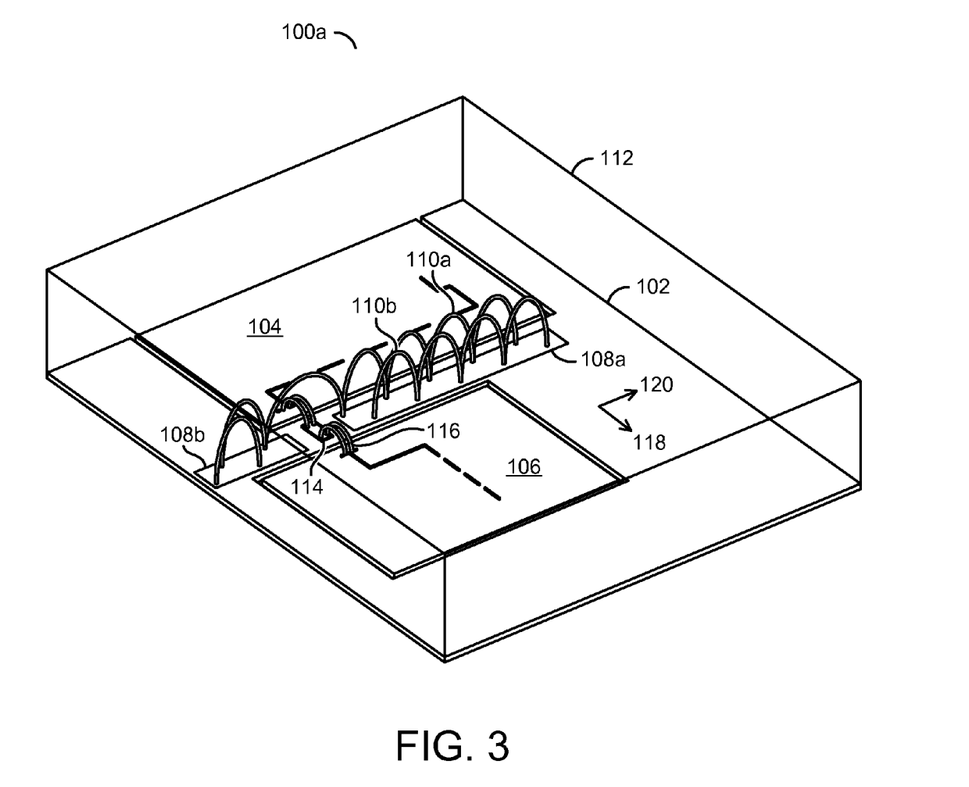
FIG. 3 is a perspective diagram of another apparatus.
Figure 4:
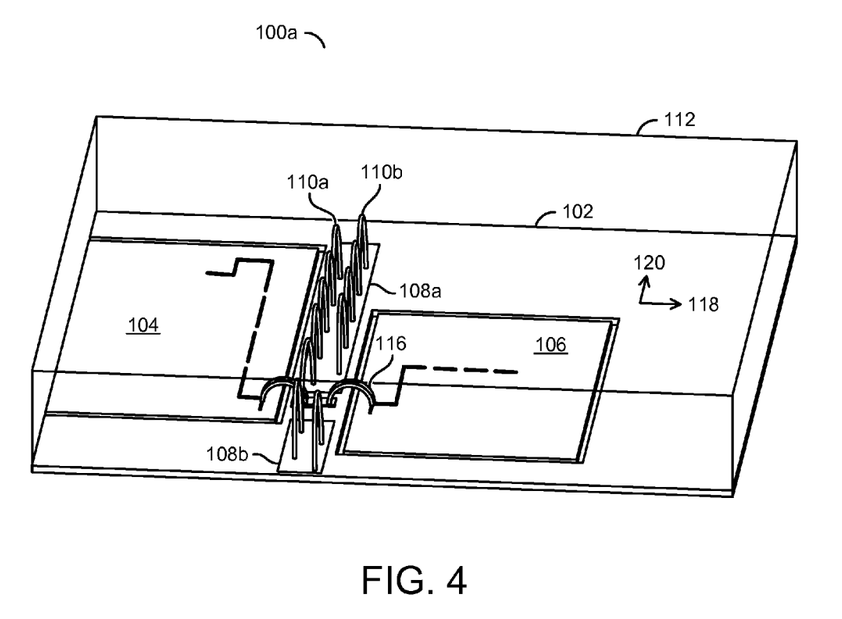
FIG. 4 is another perspective diagram of the apparatus from a different angle than in FIG. 3.

Referring to FIG. 3, a perspective diagram of an apparatus 100a is shown. The apparatus 100a may be a variation of the apparatus 100. Referring to FIG. 4, another perspective diagram of the apparatus 100a is shown from a different angle. The apparatus 100a generally comprises the package 102, the circuit 104, the circuit 106, the circuits 108a-108a, multiple circuits (or walls) 110a-110b, the lid 112, the circuit 114 and the circuit 116. The wall 110a in the apparatus 100a may be similar to the wall 110 in the apparatus 100.

The circuit 110b may implement an additional wall. The wall 110b may attach to the circuits 108a-108b, similar to the wall 110a. In various embodiments, an offset generally exists in the direction 120 between the bases of the arches in the wall 110a and the bases of the arches in the wall 110b (see FIG. 3). A separation may also exist in the direction 118 between the wall 110a and the wall 110b (see FIG. 4). The offset in the direction 120 may provide smaller gaps in the walls 110a-110b compared with the wall 110 alone. The smaller gaps generally result in better electromagnetic isolation between the circuits 104 and 106. Other numbers of walls 110a-110b may be implemented to meet the design criteria of a particular application. Other offsets between parallel walls 110a-110b may be implemented to meet the design criteria of a particular application. Other heights of the walls 110a-110b may be implemented to meet the design criteria of a particular application.

The wall 110b may also be a variation on the wall 110a in that the wall 110b is divided into multiple (e.g., two) sections. A part of the wall 110b may be bonded to the circuit 108a. Another part of the wall 110b may be bonded to the circuit 108b. A gap may exist between the two parts to avoid a conflict with the circuit 114.

Figure 5:
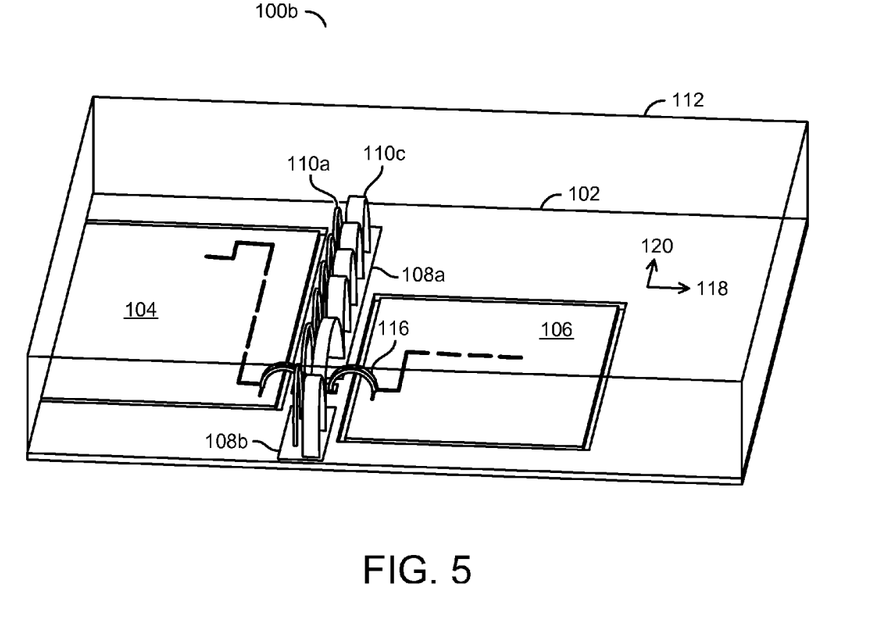
FIG. 5 is a perspective diagram of yet another apparatus.

Referring to FIG. 5, a perspective diagram of an apparatus 100b is shown. The apparatus 100b may be a variation of the apparatus 100a and/or the apparatus 100. The apparatus 100b generally comprises the package 102, the circuit 104, the circuit 106, the circuits 108a-108a, the wall 110a, a circuit (or wall) 110c, the lid 112, the circuit 114 and the circuit 116.

The circuit 110c may implement an additional wall. The wall 110c may be fabricated with a bond ribbon or a bond tape. The wall 110c may be attach to the circuits 108a-108b, similar to the wall 110a. The width of the bond ribbon/tape generally aligns with the direction 118. In various embodiments, an offset generally exists in the direction 120 between the bases of the arches in the wall 110a and the bases of the arches in the wall 110c. A separation may also exist in the direction 118 between the wall 110a and the wall 110c. The offset in the direction 120 may provide smaller gaps in the walls 110a-110c compared with the wall 110 alone. The smaller gaps generally result in better electromagnetic isolation between the circuits 104 and 106. Other numbers of walls 110a-110c may be implemented to meet the design criteria of a particular application. In various embodiments, the wall 110a may be implemented with a bond tape or bond ribbon. In some embodiments, the wall 110a may be eliminated. Other offsets between parallel walls 110a and 110c may be implemented to meet the design criteria of a particular application. Other heights of the walls 110a and 110c may be implemented to meet the design criteria of a particular application.

Figure 6:
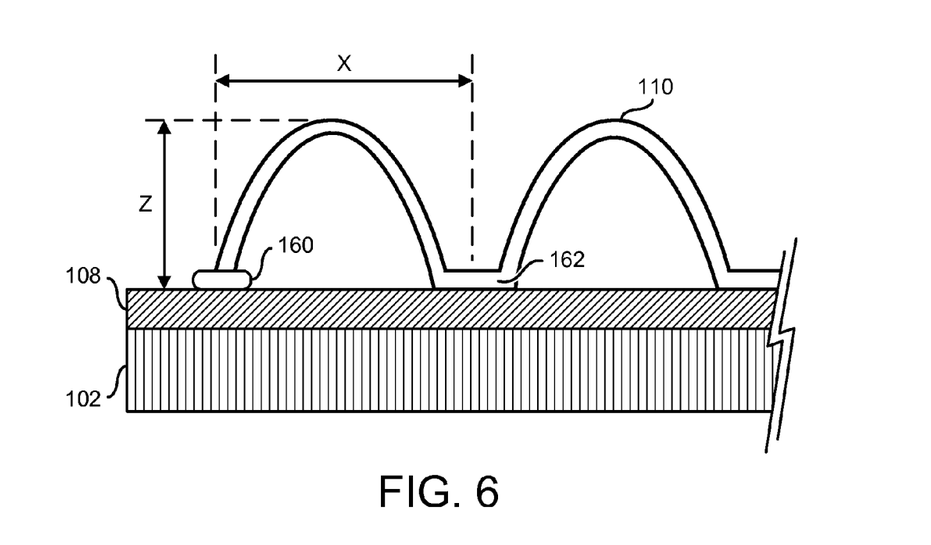
FIG. 6 is a cross-sectional diagram of a portion of a wall.

Referring to FIG. 6, a cross-sectional diagram of an example portion of the wall 110 is shown. In the example, the wall 110 is shorter than an internal height of the millimeter-wave cavity and so does not contact the lid 112. The wall 110 may be formed by wiring bonding a bond wire, tape or ribbon to the circuit 108. The wire bonding generally includes a ball bond 160 at one end of the wire/tape/ribbon. The arches may be formed to a height Z of approximately 10 micrometers to 5 millimeters. The height Z may depend on both the size of the package 102 and the lid 112 dimensions and the frequency of concern for the electromagnetic coupling. An initial arch may return to the circuit 108 where a wedge bond 162 is formed. A distance X from a center of the ball bond 160 to a center of the wedge bond 162 generally ranges from approximately 10 micrometers to 5 millimeters. The distance X may depend on the frequency of concern, with closer distances X used for higher frequencies. The arches may continue (right in the figure) with additional wedge bonds 162 until a far end of the wall 110 is reached. In various embodiments, other wire bonding configurations may be implemented. For example, one or more walls 110 may be fabricated using all ball bonds 160. In another example, one or more walls 110 may be fabricated using all wedge bonds 162. In some configurations, other bonding techniques (e.g., compliant bonding) may be implemented. Other combinations of ball bonds, wedge bonds and/or other bonding techniques may be implemented to meet the design criteria of a particular application.

Figure 7:
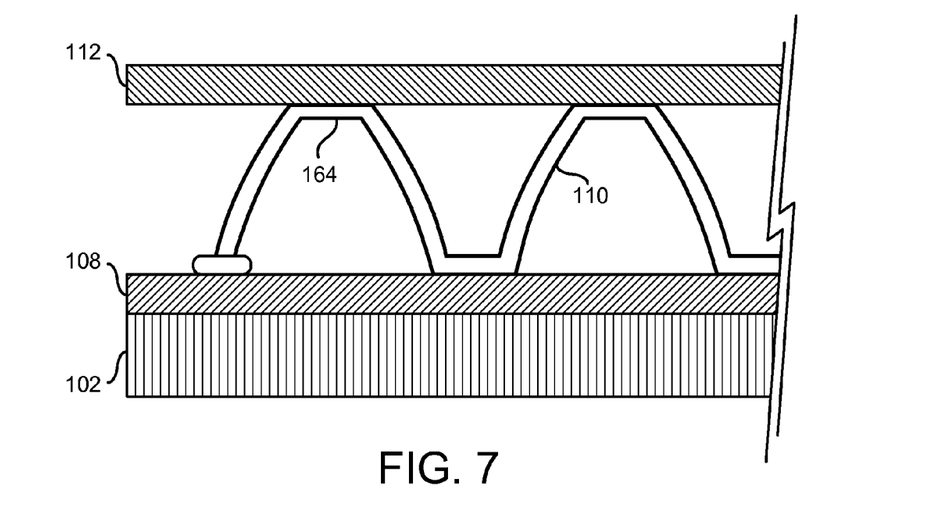
FIG. 7 is a cross-sectional diagram of another portion of the wall.

Referring to FIG. 7, a cross-sectional diagram of another example portion of the wall 110 is shown. In the example, the wall 110 is taller than an internal height of the millimeter-wave cavity and so contacts the lid 112. In some embodiments, contact between the wall and the ceiling of the lid 112 may be appropriate for mechanical and electrical reasons. The ceiling (or all) of the lid 112 may be formed of a conductive material. The conductive part of the lid 112 may be electrically grounded to the package 102 to form the enclosed millimeter-wave cavity. Tops of the arches in the wall 110 may contact the ceiling of the lid 112 providing additional electrical paths to ground.

Figure 8:
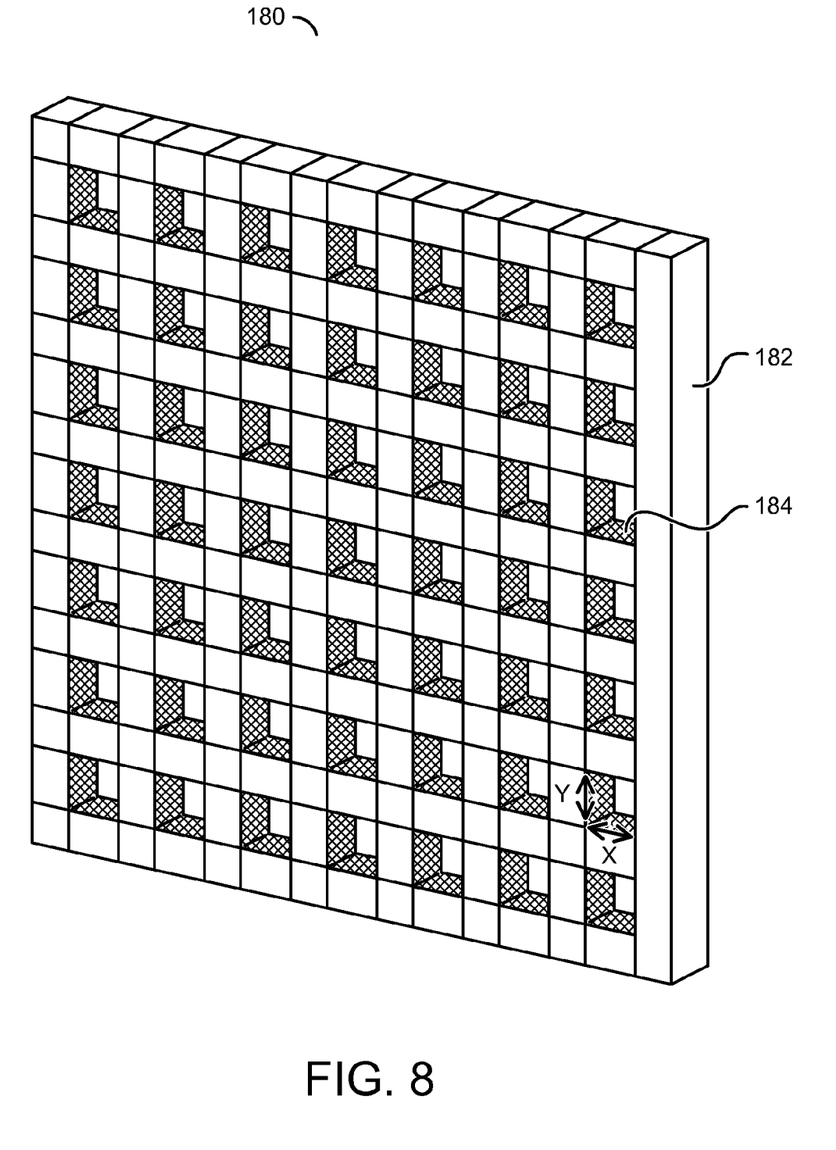
FIG. 8 is a perspective diagram of a mesh wall.

Referring to FIG. 8, a perspective diagram of an example mesh wall 180 is shown. The mesh wall 180 may be used to estimate the attenuation characteristics of the wall 110 to achieve a specified attenuation between the circuits 104 and 106. A design of a wall 110 may be determined in the step 148 using, in part, the estimated attenuation characteristics of the mesh wall 180. In various embodiments, the design of the wall 110 may be also be based on the size of the cavity in the package 102 and the lid 112. The size of the cavity may be determined by an existing package design with established pin-outs expected by customers. In the example shown, the mesh wall 180 generally comprises multiple rows and multiple columns of wires 182. The wires 182 may form a series of openings 184. Each opening 184 may have similar sizes in both dimensions (e.g., an X-dimension and a Y-dimension). In some simulations, the wires 182 may be modeled as square wires.

Figure 9:
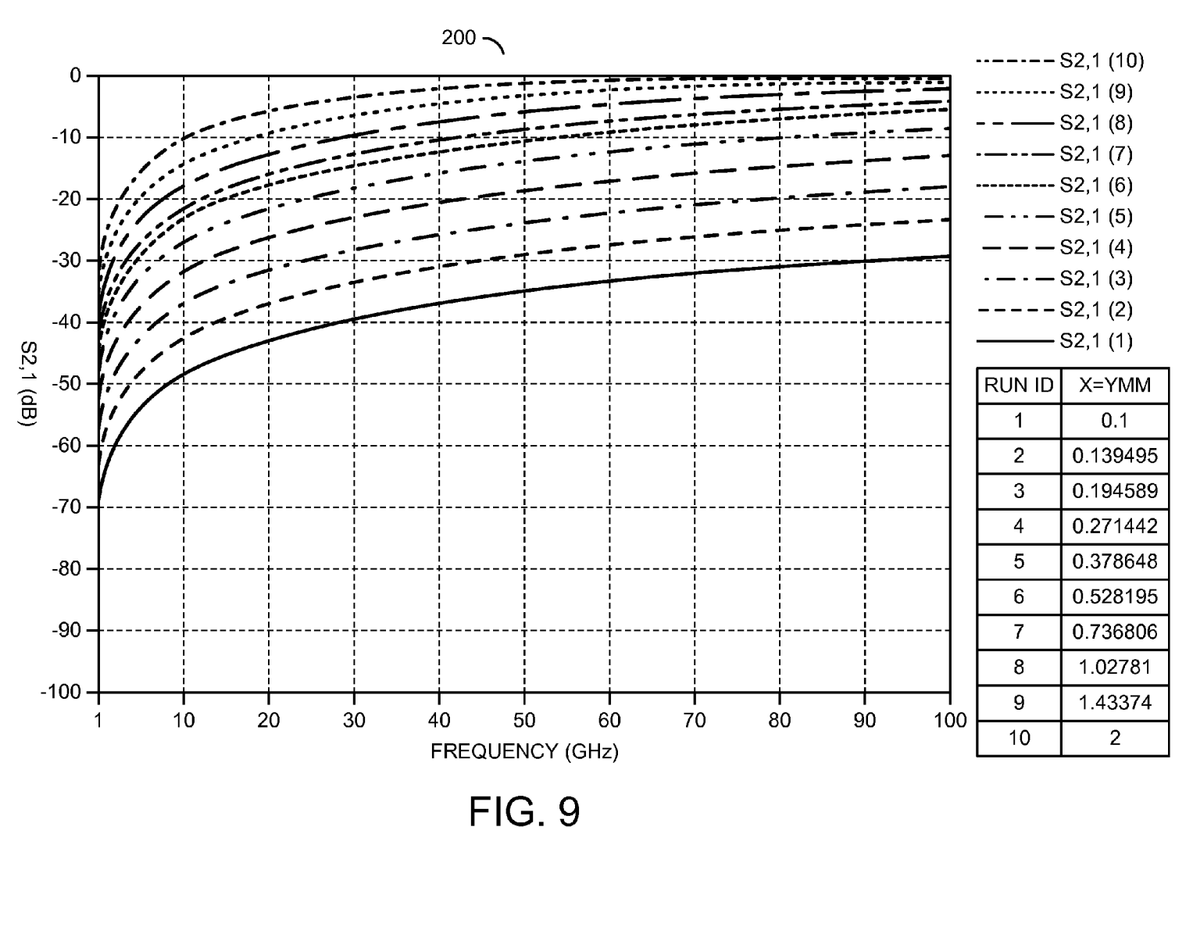
FIG. 9 is a graph of radio frequency forward gains through the mesh wall.

Referring to FIG. 9, a graph 200 of radio frequency forward gains through the mesh wall 180 is shown. The graph 200 generally illustrates multiple curves of a forward gain S-parameter (e.g., S2,1). The S-parameter S2,1 is generally a ratio of a signal passing through the mesh wall 180 over a signal incident on the mesh wall 180. A range of the forward gains is generally illustrated in decibels (e.g., 0 dB to −100 dB) with respect to a range of frequencies (e.g., 1 GHz to 100 GHz). The wires 182 were modeled at a size of 21 μm by 21 μm. Other sizes of wires and openings may be simulated to meet the criteria of a particular design application.

Different simulation runs (e.g., different run identification values) of the S-parameter curves were performed with different sized openings 184 in the mesh wall 180. In each simulation run, each opening 184 in the mesh wall 180 had a similar size in the X-dimension and the Y-dimension (e.g., X=Y). The opening dimensions ranged from 0.1 mm (Run ID 1) to 2 mm (Run ID 10). Attenuation (e.g., negative dB values) of the mesh wall 180 in the E-band generally ranged from about −34 dB at 60 GHz (Run ID 1) to about −1 dB at 90 GHz (Run ID 10). The attenuation generally increased as the openings 184 became smaller.

The functions and structures illustrated in the diagrams of FIGS. 1-9 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors.

While the invention has been particularly shown and described with reference to the preferred embodiments thereof, it will be understood by those skilled in the art that various changes in form and details may be made without departing from the scope of the inventio n.

The invention claimed is:

1. An apparatus comprising:
    a package configured to mount a plurality of chips, wherein (i) two of said chips generate a plurality of signals in a millimeter-wave frequency range, (ii) a metal is exposed at a surface of said package between said two chips and (iii) said metal is connected to an electrical ground;
    a wall formed on said metal and between said two chips, wherein said wall comprises a plurality of arches that (i) are conductive, (ii) are wire bonded to said metal and (iii) attenuate an electromagnetic coupling between said two chips at said millimeter-wave frequency;
    at least one path at said surface of said package and configured to connect said two chips electrically; and
    a lid configured to enclose said chips to form a millimeter-wave cavity.

2. The apparatus according to claim 1, wherein said wall extends along a line parallel to facing sides of said two chips.

3. The apparatus according to claim 1, wherein said arches comprise at least one of (i) one or more bond wires, (ii) one or more bond ribbons and (iii) one or more bond tapes.

4. The apparatus according to claim 1, wherein said lid contacts one or more of said arches when said lid is joined to said package.

5. The apparatus according to claim 1, further comprising an additional wall formed on said metal and between said two chips, wherein said wall and said additional wall are (i) parallel to each other and (ii) separated from each other in a first direction.

6. The apparatus according to claim 5, wherein (i) said arches of said additional wall are offset relative to said arches of said wall in a second direction and (ii) said second direction is different than said first direction.

7. The apparatus according to claim 1, wherein at least one of said arches straddles said path.

8. The apparatus according to claim 1, wherein said path passes through a gap between two of said arches.

9. The apparatus according to claim 1, wherein said two chips comprise (i) a frequency up-converter chip and (ii) an amplifier chip configured to amplify one of said signals in a 60 gigahertz to 90 gigahertz range.

10. A method for implementing an electromagnetic wall in a millimeter-wave cavity, comprising the steps of:
    mounting a plurality of chips on a package, wherein (i) two of said chips generate a plurality of signals in a millimeter-wave frequency range, (ii) a metal is exposed at a surface of said package between said two chips and (iii) said metal is connected to an electrical ground;
    forming a wall on said metal and between said two chips, wherein said wall comprises a plurality of arches that (i) are conductive, (ii) are wire bonded to said metal and (iii) attenuate an electromagnetic coupling between said two chips at said millimeter-wave frequency;
    connecting said two chips electrically along at least one path at said surface of said package; and
    enclosing said chips with a lid to form said millimeter-wave cavity.

11. The method according to claim 10, wherein said wall extends along a line parallel to facing sides of said two chips.

12. The method according to claim 10, wherein said arches comprise at least one of (i) one or more bond wires, (ii) one or more bond ribbons and (iii) one or more bond tapes.

13. The method according to claim 10, wherein said lid contacts one or more of said arches when said lid is joined to said package.

14. The method according to claim 10, further comprising the step of:
    forming an additional wall on said metal and between said two chips, wherein said wall and said additional wall are (i) parallel to each other and (ii) separated from each other in a first direction.

15. The method according to claim 14, wherein (i) said arches of said additional wall are offset relative to said arches of said wall in a second direction and (ii) said second direction is different than said first direction.

16. The method according to claim 10, wherein at least one of said arches straddles said path.

17. The method according to claim 10, wherein said path passes through a gap between two of said arches.

18. An apparatus comprising:
    means for mounting a plurality of chips, wherein (i) two of said chips generate a plurality of signals in a millimeter-wave frequency range, (ii) a metal is exposed at a surface of said means for mounting between said two chips and (iii) said metal is connected to an electrical ground;
    means for attenuating formed on said metal and between said two chips, wherein said means for attenuating comprises a plurality of arches that (i) are conductive, (ii) are wire bonded to said metal and (iii) attenuate an electromagnetic coupling between said two chips at said millimeter-wave frequency;
    means for connecting said two chips electrically along at least one path at said surface of said means for mounting; and
    means for enclosing said chips to form a millimeter-wave cavity.

19. The apparatus according to claim 1, where (i) said package is planar and (ii) said lid has multiple surfaces that form said millimeter-wave cavity with said package.

20. The apparatus according to claim 19, where each of said two chips has (i) a surface mounted to said package and (ii) an opposite surface wire bonded to said path.

* * * * *